Nov. 13, 1962 A. E. SANDERSON 3,064,143

SYMMETRICAL CLIPPING CIRCUIT WITH ZENER DIODE

Filed Dec. 11, 1958

INVENTOR
Albert E. Sanderson

BY
Mead, Browne, Schuyler & Beveridge
ATTORNEYS

United States Patent Office 3,064,143
Patented Nov. 13, 1962

3,064,143

SYMMETRICAL CLIPPING CIRCUIT WITH ZENER DIODE

Albert E. Sanderson, Concord, Mass., assignor, by mesne assignments, to Aircraft Radio Corporation (1958), Boonton, N.J., a corporation of New Jersey Filed Dec. 11, 1958, Ser. No. 779,660
2 Claims. (Cl. 307—88.5)

This invention relates to a symmetrical voltage clipping circuit.

Conventional voltage clipping circuits employ pairs of reversed diodes: one diode biased to shunt the positive peaks of the incoming voltage to ground; while the other diode is biased to shunt the negative peaks of the incoming voltage to ground. Such circuits usually require a separate source of D.-C. voltage as a reference.

It is an object of this invention to provide a clipping circuit which clips the maximum and minimum peaks of an A.-C. voltage without need of an auxiliary voltage reference source.

It is a further object of this invention to provide a symmetrical clipping circuit employing a minimum of components.

In accordance with the invention an unbiased diode of the p-n junction type is connected in shunt across a source of A.-C. voltage. The reverse breakdown voltage or Zener voltage of the p-n junction diode determines one limit of operation of the circuit while the forward voltage determines the other limit so the voltage is limited to a peak to peak value not exceeding the Zener voltage of the diode. Capacitors connected in the input circuit and output circuit prevent any average D.-C. from flowing through the diode which might tend to shift the voltage operating level of the diode. In addition to the internal impedance of the A.-C. voltage source, an impedance may be connected in series therewith to serve as a voltage dropping element when the diode is conducting.

When a periodically varying voltage is applied across the circuit, equal portions of the maximum and minimum peak voltage excursions are shunted to ground through the diode; i.e., the diode is, therefore, conductive twice during each cycle of the input voltage.

Other objects and advantages of the invention will become apparent after a consideration of the following specification and accompanying drawing wherein.

Figure 2:
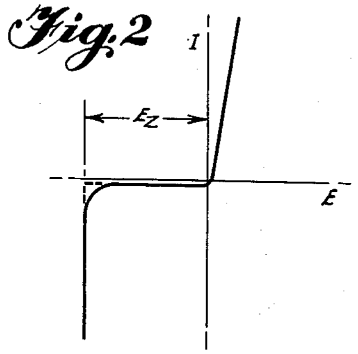
FIG. 2 is a graph showing operating characteristics of a p-n junction diode used in FIG. 1.

As is well known, p-n junction diodes have peculiar voltage-current characteristics. As illustrated in FIG. 2, a p-n junction diode is rendered conductive when the applied voltage exceeds a certain maximum in either direction. Thus, over certain limits (from the region where $E=0$ to $E=E_z$) the diode presents a relatively high impedance and is non-conducting. However, when $E=E_z$ the current increases rather rapidly without any appreciable change in reverse voltage. This point, commonly called the Zener voltage, or the reverse breakdown voltage, is one limit on the magnitude of voltage at which the diode will exhibit high impedence properties.

Referring again to FIG. 2 it will be observed that when the diode is biased in a forward direction, by applying a positive voltage to the anode of the diode, the diode is rendered conductive and presents a relatively low impedance to such a positive voltage. This sets the upper limit at which the diode exhibits high impedance properties. By proper choice of p and n materials, and construction of the junction, the reverse breakdown voltage of the diode may be varied between wide limits. In some p-n junction diodes the reverse breakdown voltage may cover a range between one and four hundred volts. Thus, the circuit is limited only in the selection of a suitable p-n junction diode.

Figure 1:
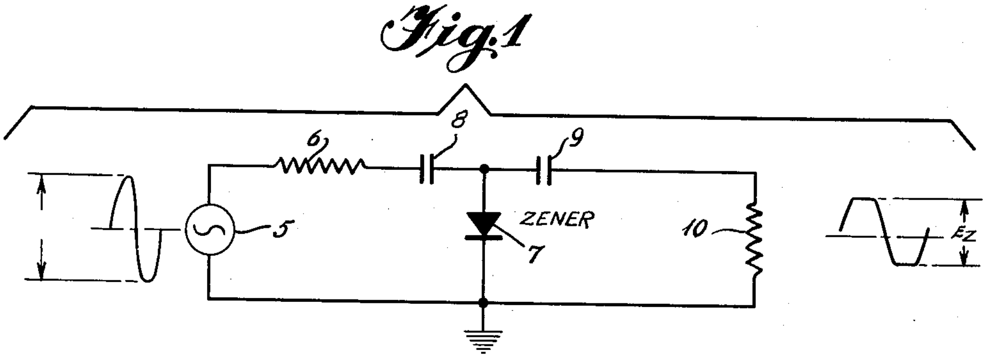
FIG. 1 is a schematic drawing of a voltage clipping circuit embodying the invention.

Referring now to FIG. 1, an A.-C. source 5 applies a sinusoidal A.-C. voltage to the input terminals of the clipping circuit comprising resistance 6, a p-n junction diode 7, and D.-C. blocking capacitors 8 and 9. The symmetrically clipped output voltage is developed across load resistor 10.

In operation, an A.-C. voltage, as developed by source 5, is applied to the clipping circuit. Such an A.-C. voltage is shown to the left in FIG. 1. As the positive portion of the signal reaches the forward voltage of the p-n junction diode, the diode begins to conduct and shunts a portion of the voltage through the diode 7 to ground. A flat topped wave appears in the output and is developed across load resistor 10.

When the applied voltage has dropped below the forward voltage of the diode and is within the order of magnitude of from $E_0$ to $E_z$, the diode again appears as a relatively high impedance so that the shunting effect of the diode is negligible. However, when the negative portion of the sinusoidal wave reaches a magnitude of the order of $E_z$, the reverse breakdown voltage of the diode, the diode again conducts, and voltage in excess of the Zener breakdown voltage is also shunted to ground to clip the negative peak of the signal. To the right of FIG. 1 is a symmetrically clipped wave form as developed by the clipper circuit. Blocking capacitors 8 and 9 prevent the flow of any average D.-C. to the diode 7 so the diode automatically assumes a bias equal to one-half the Zener breakdown voltage and clips symmetrically about that point. Hence, a clipped voltage appears across resistor 10.

Figure 3:
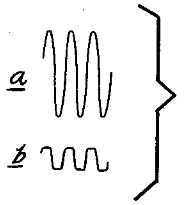
FIGS. 3 and 4 are graphical comparisons of input and output voltages in the clipping circuit shown in FIG. 1.
Figure 4:
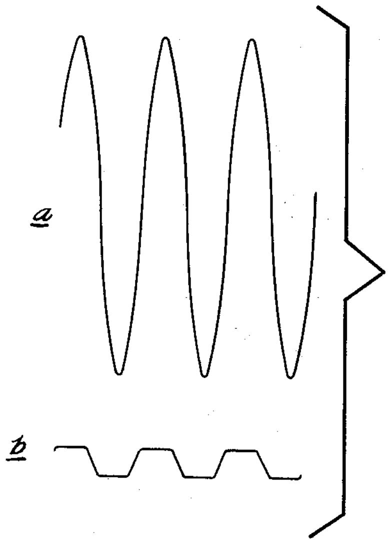

By way of example, FIGURE 3 shows the clipping effect on a wave of 8 volts R.M.S. (22 volts peak to peak) having a frequency of 1,000 cycles. By choosing a p-n junction diode which has a reverse breakdown voltage of approximately 6 volts, the clipped voltage has a magnitude of 6 volts peak to peak. FIGURE 4 shows similar wave forms where the A.-C. voltage applied is 30 volts R.M.S. (85 volts peak to peak) 1,000 cycles per second and again the clipped output voltage has a magnitude of 6 volts peak to peak.

While there have been shown and described and pointed out the fundamental novel features of the invention as applied to a preferred embodiment, it will be understood that various omissions and substitutions and changes in the form and details of the circuit illustrated and in its operation may be made by those skilled in the art, without departing from the spirit of the invention. It is the intention therefore to be limited only as indicated by the scope of the following claims.

What is claimed is:

1. A symmetrical voltage clipping circuit comprising an input circuit, an output circuit, a p-n junction diode having a reverse breakdown voltage which is less than the peak to peak amplitude of an applied alternating current voltage connected in shunt between said input and output circuits, an impedance connected in series with said input circuit and said diode, and capacitor means serially connected in said input circuit and output circuit for blocking the flow of any average direct current through said diode and said output circuit.

2. A circuit for modifying a first alternating voltage to produce a regulated square wave alternating voltage symmetrically positioned about the reference potential of said first alternating current signal comprising an input circuit to which the first alternating current signal voltage is applied, an output circuit from which the square shaped alternating current voltage is taken, a Zener junction diode having a reverse breakdown voltage which is less than the peak-to-peak amplitude of said applied alternating current voltage connected in shunt across said input and said output circuits, a resistor and a capacitor connected in series between said input circuit and said Zener diode and a capacitor connected in series between said output circuit and said Zener diode for blocking the flow of any average direct current through said Zener diode and said output circuit.

References Cited in the file of this patent

UNITED STATES PATENTS

| | | |
|---|---|---|
| 2,714,702 | Shockley | Aug. 2, 1955 |
| 2,730,632 | Curtis | Jan. 10, 1956 |
| 2,819,442 | Goodrich | Jan. 7, 1958 |
| 2,829,282 | Hughes | Apr. 1, 1958 |
| 2,850,650 | Meacham | Sept. 2, 1958 |
| 2,927,223 | Mierowitz | Mar. 1, 1960 |
| 2,992,399 | Van Tassel | July 11, 1961 |

OTHER REFERENCES

The Radio Amateur's Handbook, 31st ed., 1954, page 57, "R.A.H."